US006655975B1

(12) United States Patent
Liedtke

(10) Patent No.: US 6,655,975 B1
(45) Date of Patent: Dec. 2, 2003

(54) SEALED HOUSING ASSEMBLY

(75) Inventor: Michael Eric Liedtke, Kent, OH (US)

(73) Assignee: Delta Systems, Inc., Streetsboro, OH (US)

( * ) Notice: Subject to any disclaimer, the term of this patent is extended or adjusted under 35 U.S.C. 154(b) by 0 days.

(21) Appl. No.: 10/319,095

(22) Filed: Dec. 13, 2002

(51) Int. Cl.⁷ .............................................. H01R 13/52
(52) U.S. Cl. ...................... 439/276; 439/910; 439/936; 439/76.1; 439/75
(58) Field of Search ................................ 439/276, 936, 439/910, 76.1, 75

(56) References Cited

U.S. PATENT DOCUMENTS

| | | | | |
|---|---|---|---|---|
| 4,729,743 A | * | 3/1988 | Farrar et al. ................. | 439/276 |
| 5,278,357 A | * | 1/1994 | Yamanashi ................... | 439/936 |
| 6,377,168 B1 | | 4/2002 | Harvey | |
| 6,500,027 B1 | * | 12/2002 | Van Der Sanden et al. . | 439/936 |

OTHER PUBLICATIONS 5 page website of Sendec Corporation, www.sendec.com/meters/html/8xx100.html (visited Mar. 4, 2003).
3 page website of Honeywell Inc., www.hobbs-corp.com/cat1 hr3.asp (visited Mar. 4, 2003).
2 page website of ENM Company, www.enmco.com:7786/enm catalog/scan/se+i/se+result/sf+search/tf+series/s . . . (visited (Mar. 4, 2003).
2 page product information of Curtis Instruments, Inc., Model 700H (2001).
7 page product information of Curtis Instruments, Inc., 7000 Series Solid State Hour Meters & Counters (2002).
2 page product information of Curtis Instruments, Inc., 730 Series Mini-Cluster (1999).
2 page product information of Curtis Instruments, Inc., Model 732K (2001).

* cited by examiner

*Primary Examiner*—Tho D. Ta
(74) *Attorney, Agent, or Firm*—Watts & Hoffmann Co.

(57) ABSTRACT

A sealed electrical assembly that includes a housing having an opening at an end. An electrical device is positioned in the housing. The electrical device includes a lead that extends out of the open end. A cover is positioned within the opening. The cover includes a plate portion and a tab portion spaced apart from the plate portion. The tab portion extends into a cutout in the housing that is located between the plate portion and the housing end to position the cover with respect to the housing. A sealant is disposed around a perimeter of the plate portion to provide a seal between the cover and the housing. A portion of the sealant is disposed in a space between the cutout and the plate portion to prevent leakage through the cutout.

20 Claims, 5 Drawing Sheets

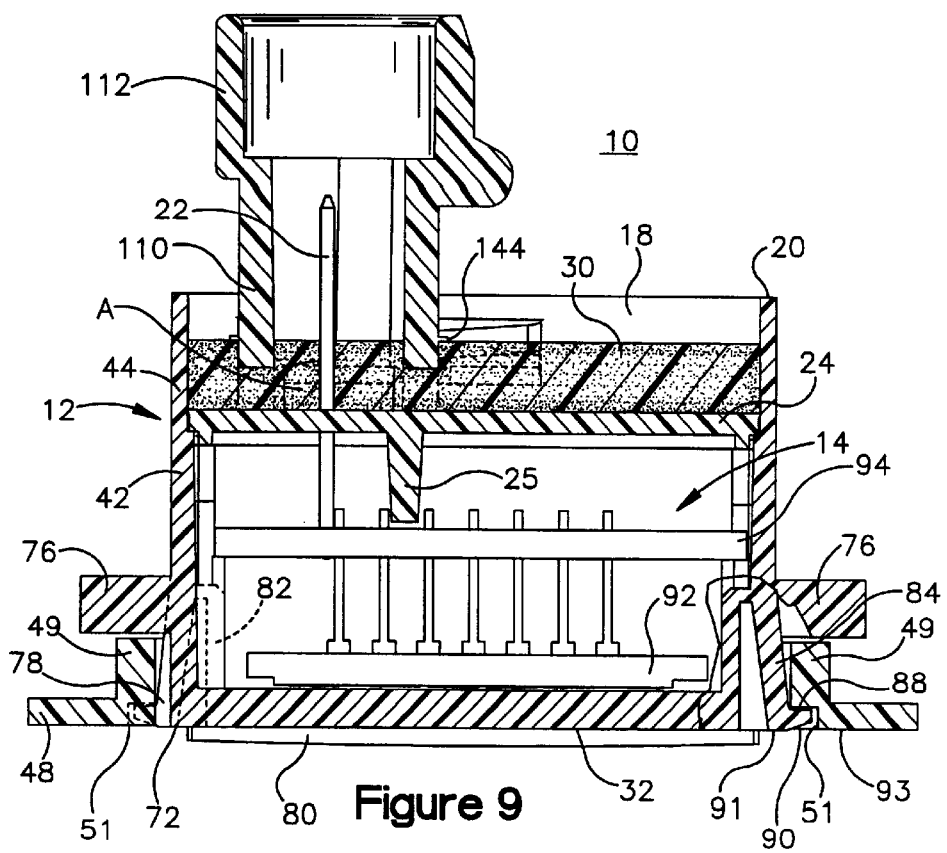
Figure 9
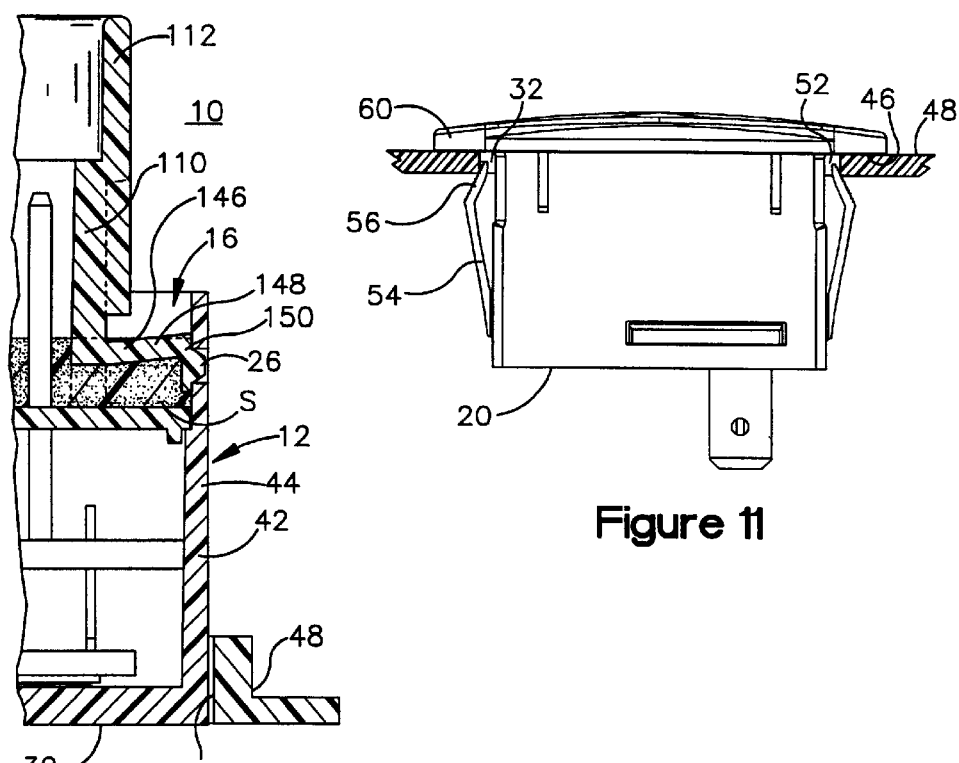
Figure 10
Figure 11

SEALED HOUSING ASSEMBLY

FIELD OF THE INVENTION

The present invention is directed to a sealed electrical assembly, more specifically, to an electrical assembly having a cover with tab portions spaced apart from a back surface of the cover to facilitate sealing of the electrical assembly.

BACKGROUND ART

Electrical assemblies are packaged in, a wide variety of different housing assemblies. Referring to FIG. 1, one type of prior art housing assembly includes a housing 1 with an open end 2 and a cover 3 with tabs 4 that snap into cutouts 5 in the housing to secure the cover to the housing. One advantage of the type of housing assembly illustrated by FIG. 1 is that it is very easy to put together. One disadvantage of the type of assembly illustrated by FIG. 1 is that water can easily migrate past the cover 3 or through the cutouts 5 into the housing assembly and damage the enclosed electronics.

A variety of sealed housing assemblies are available. One type of sealed housing assembly includes a housing and a cover that is welded to the housing. Welded housing assemblies are expensive to assemble because the welding operation is difficult and time consuming.

Potting material has been used to seal electrical assemblies. In traditional potted housing assemblies, potting material is dispensed into the housing to seal the enclosed electronics. A cover may be placed over the potting or the potting material may be used in lieu of a cover. One disadvantage of a traditional potted housing assembly is that the electrical parts enclosed in the housing assembly are covered with the potting material. Once the parts are covered with the potting material the parts cannot be visually inspected. In the case of an electrical assembly that includes a display, such as a meter, it is particularly undesirable to contact the viewed surface. of the display with potting and conceal a portion of the display.

There is a need for a sealed housing assembly that is easy to put together. Further, there is a need for a sealed housing assembly that allows the electrical components to be visually inspected after the housing assembly is sealed. There is also a need for a sealed meter housing assembly that prevents potting from contacting the display.

SUMMARY OF THE INVENTION

The present invention is directed to a sealed electrical assembly. The electrical assembly includes a housing having an opening at one end. An electrical device is positioned in the housing. The electrical device includes a lead that extends out of the open end of the housing. A cover is positioned within the opening of the housing. The cover includes a plate portion and a tab portion spaced apart from the plate portion. The tab portion extends into a cutout in the housing and is located between the plate portion and the housing end. The tab in the cutout positions the cover with respect to the housing. A sealant is applied to an outer surface of the cover such that sealant is disposed around the perimeter of the plate portion. The sealant provides a seal between the cover and the housing. A portion of the sealant is disposed in a space between the tab portion and the plate portion of the cover, such that fluid is prevented from migrating into the housing through the cutout.

In one embodiment, the electrical assembly is a sealed visible meter assembly, such as hour meter for a lawn and garden tractor. In this embodiment, the housing is transparent with a front wall and four side walls. A meter circuit including a display is positioned in the housing, such that the display is visible through the transparent front wall of the housing. Leads of the metering circuit extend out of the open end of the housing. The cover includes a plate portion, a pair of wings extending away from the surface of the plate portion and a pair of rectangular tab portions that extend from the wing portions. The tabs extend into a pair of cutouts in the side wall of the housing to position the cover with respect to the housing. Sealant, such as a potting material, is disposed on the cover to provide a seal between the cover and the housing. The sealant may be disposed around the leads to provide a seal around the leads.

The housing may include latching projections that facilitate mounting of the housing to a panel. These projections facilitate a snap-in mounting of the housing assembly to a panel. In one embodiment, the latching projections facilitate mounting of the housing to a panel from the front. In one embodiment, the latching projections facilitate mounting of the housing assembly to a panel from the rear.

In one method of sealing an electrical housing assembly, an electrical device is positioned in the housing such that a lead of the electrical device extends out of the open end. A cover including plate portion and tab portion spaced apart from the plate portion is positioned in the housing. The tab portion is inserted into a cutout in the housing that is located between the plate portion and the housing end. A sealant is applied to the cover, such that sealant is disposed around the perimeter of the plate portion. The sealant provides a seal between the cover and the housing. A portion of the sealant is applied in a space between the tab portion and the plate portion to prevent fluid from. migrating through the cutout into the housing.

The housing assembly of the present invention is sealed and is easy to put together. Another advantage of the housing assembly of the present invention is that the electrical components enclosed in the housing can be visually inspected after the housing assembly is sealed when the housing is made from a transparent material. The housing assembly of the present invention prevents a sealant or potting from contacting the electrical components in the housing, such as a display.

These and other objects, advantages and features of the invention will become better understood from a detailed description of an exemplary embodiment of the invention which is described in conjunction with the accompanying drawings.

BRIEF DESCRIPTION OF THE DRAWINGS

FIG. 9 is a sectional view taken along lines 9—9 of FIG. 7;

FIG. 10 is a partial sectional view taken along lines 10—10 of FIG. 7; and,

FIG. 11 is a sectional view of a front mount housing assembly mounted in a cutout in a panel.

BEST MODE FOR PRACTICING THE INVENTION

Figure 1:
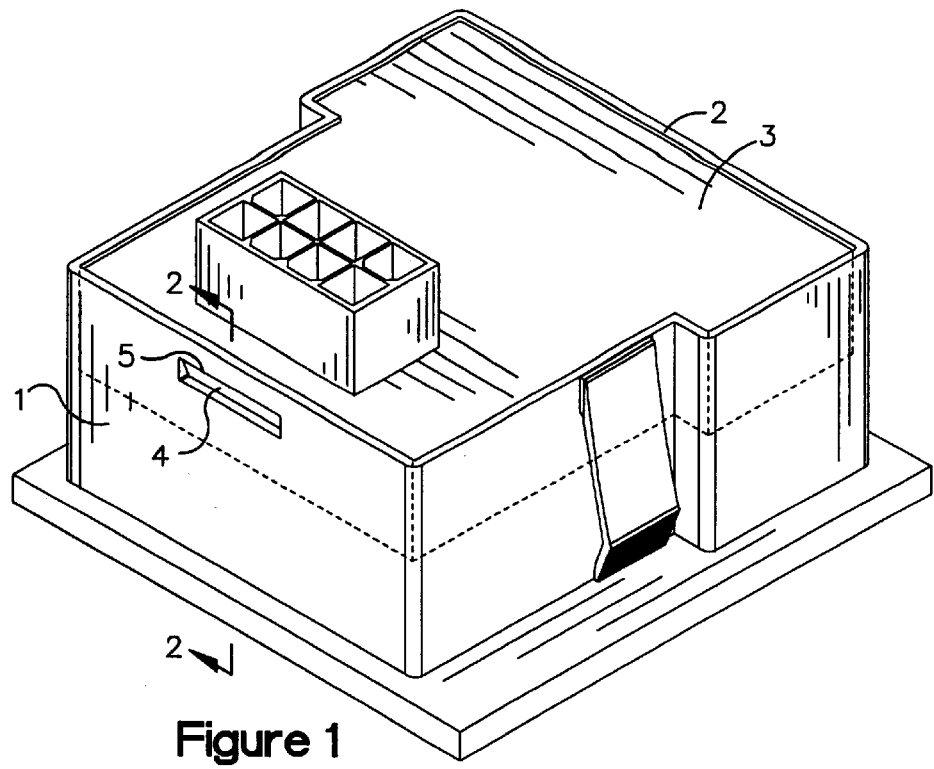
FIG. 1 is a perspective view of a prior art housing assembly.
Figure 2:
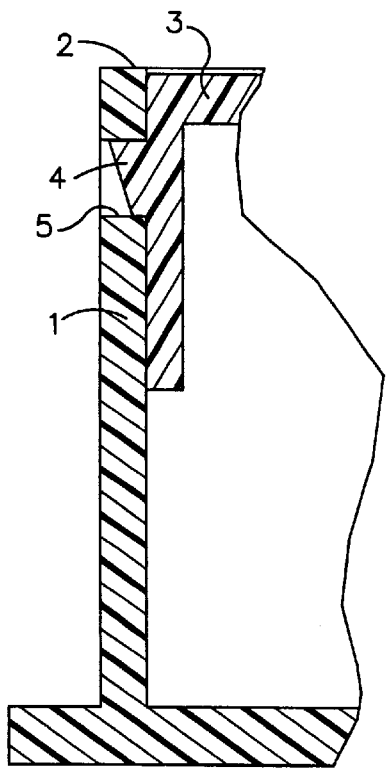
FIG. 2 is a sectional view taken along lines 2—2 of FIG. 1.

The present disclosure is directed to a sealed electrical assembly 10. The electrical assembly 10 includes a housing 12, an electrical device 14 positioned in the housing and a cover 16. In the illustrated embodiments, the housing has an opening 18 at an end 20. The electrical device 14 includes leads 22 that extend out of the opening 18 in the illustrated embodiment. The cover 16 is positioned within the opening 18. The illustrated cover 16 includes a plate portion 24 and one or more tab portions 26 spaced apart from the plate portion. In the exemplary embodiment, each tab portion extends into a cutout 28 in the housing 12. The cutout 28 locates the tab portion(s) between the plate portion 24 and the end 20 of the housing. The tab portion(s) 26 positioned in the cutout(s) 28 position the cover 16 with respect to the housing 12. Referring to FIGS. 5–7 and 9–10, a sealant 30 or potting is applied to the cover to provide a seal between the cover and the housing. In the exemplary embodiment, the sealant covers a perimeter P of the plate portion 24 to provide a seal between the cover and the housing. A portion of the sealant 30 is disposed in a space S between each tab portion 26 and each plate portion 24 (FIGS. 6 and 10).

In the illustrated embodiments, the electrical device 14 is a meter assembly. In the exemplary embodiment, the housing 12 is made from a transparent material to allow the electrical device (a visual meter in the exemplary embodiment) to allow the electrical device to be viewed through the front wall 32.

The illustrated housing 12 is defined by a front wall 32 and first, second, third and fourth side walls 34, 36, 38, 40. It should be readily apparent to those skilled in the art that the housing could have a shape that does not include four side walls. For example, the housing could be round, oval or could have a combination of flat and/or curved segments. The side walls 34, 36, 38 and 40 extend generally orthogonally from the front wall 32 in the illustrated embodiments. The second and fourth side walls 36, 40 each include a cutout 28. In the illustrated embodiment, the cutout 28 in the side walls is rectangular in shape. The housing 12 illustrated in FIGS. 3–6 is a front mount housing 42. The housing illustrated in FIGS. 7–10 is a rear mount housing 44.

A front mount housing 42 snaps in from the front of a panel 48 (see FIG. 11). The front wall 32 of the front mount housing extends outwardly past one or more of the side walls 34, 36, 38, 40 to form a lip 46. In the embodiment illustrated by FIGS. 3–6 and 11 the front wall extends past all four side walls. In this embodiment, the lip 46 extends around all four side walls 34, 36, 38, 40. Referring to FIG. 11, the lip prevents the housing 42 from being pushed through an opening 52 in the panel.

The front mount housing 42 includes a pair of wings or flanges 50 on the first and third walls 34, 38 of the housing. The wings 50 hold the housing in a cutout 52 in the panel. The wings 50 extend from the housing walls near the end 20 toward the front wall 32. In the illustrated embodiment, each wing 50 includes a first portion 54 that is connected to and extends away from a housing wall at angle. A second portion 56 of each wing extends from the first portion 54 at an angle, back toward the housing wall. In the exemplary embodiment, the second portion 56 is not connected to the housing. In the illustrated embodiment, the second portion includes serrations 58.

FIG. 11 illustrates a front mount housing installed in a cutout 52 of a panel 48. One such panel that the housing may be mounted in is a dashboard of a riding lawn and garden tractor. The front mount housing 42 is installed in the panel 48 by pushing the end 20 through the cutout 52. The wings 50 flex toward the housing walls as the first portion 54 of each wing is engaged by the panel 48. The wings snap back out when the panel 48 reaches the second portion 56 of each wing. The wings hold the front wall 32 of the housing 42 against the panel 48. The serrations 58 prevent the panel 48 from sliding over the second portion 56 of each wing portion 52.

Figure 3:
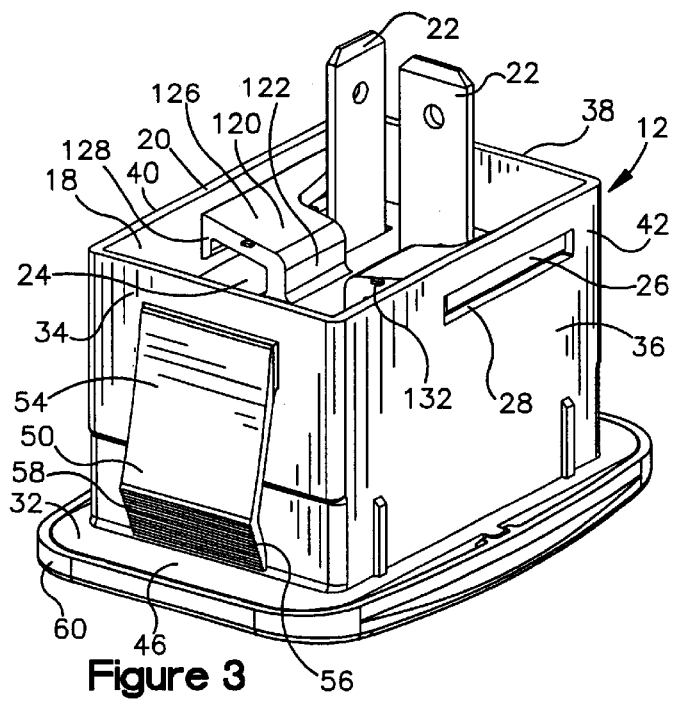
FIG. 3 is a perspective view of an unpotted or unsealed electrical meter assembly.
Figure 4:
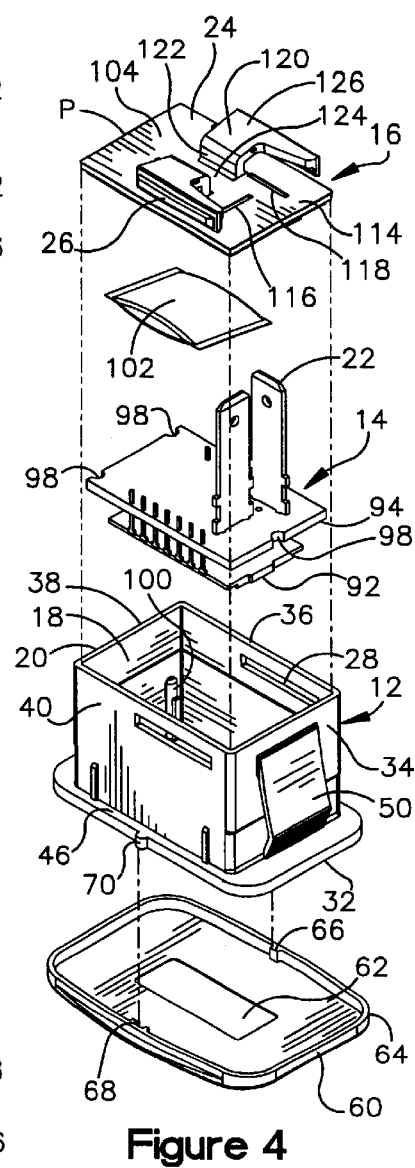
FIG. 4 is an exploded perspective view of an unpotted or unsealed electrical meter assembly.

In the embodiment illustrated by FIGS. 3–6 and 11, a faceplate 60 covers the front wall 32. The faceplate 60 includes a cutout 62 that allows the meter to be viewed through the front wall. In the exemplary embodiment, the faceplate 60 is made from an opaque material that conceals the remainder front wall 32 from view. The faceplate 60 may be welded to the front wall 32 or molded to the front wall. Referring to FIG. 4, the illustrated faceplate 60 includes a wall 64 that extends around the perimeter of the faceplate. The wall 64 fits around the front wall 32. In the exemplary embodiment the face plate 60 includes a projection 66 and a pair of projections 68 that extend inward from the wall 64. The projection 66 and pair of projections 68 ensure proper orientation and alignment of the faceplate 60 with respect to the front wall 32. A projection 70 that extends laterally from the lip 46 extends between the pair of projections 68. A recess (not shown) is included in the lip 46 opposite the projection 70. The projection 66 extends into the recess in the lip of the front wall.

Referring to FIGS. 7–10, a rear mount housing 44 snaps in from the rear of a panel 48. The panel 48 illustrated in FIG. 9 includes a section 49 of the greater thickness than the remainder of the panel. The panel 48 illustrated in FIG. 9 also includes areas 51 of reduced thickness. The front wall 32 of the rear mount housing 44 does not extend outward past the side walls. As a result, a lip is not formed around the side walls 34, 36, 38, 40 of the rear mount housing 44. The absence of a lip around the side walls allows the housing 44 to be pushed into a cutout 72 in a panel from the rear with the sidewalls close to edges of the cutout (see FIGS. 9 and 10).

The rear mount housing 44 includes a pair of tabs 76 that extend laterally outward from side walls 34, 38. In the illustrated embodiment, the tabs 76 do not extend completely across the side walls 34, 38. The tabs 76 act as a stop as the rear mount housing 44 is inserted into a cutout 52 in a panel 48. The illustrated tabs are positioned for a panel having a section 49 of greater thickness. The tabs 76 could be moved accordingly to accommodate a panel having a uniform thickness.

The illustrated rear mount housing 44 includes a latching member 78 at each corner 79 of a front 80 of the housing 44. Each corner 79 includes a rectangular recess 82. The latching members extend from the recesses 82 away from the housing 44. The recesses 82 allow the latching members to be pressed inward such that the latching members 78 do not extend substantially outward of the first and third walls 34, 38. The latching members 78 hold the housing in a cutout 52 in the panel 48.

In the illustrated embodiment, each latching member includes an elongated portion 84 that is connected to and extends away from a housing wall at an angle. A latch portion 86 extends outwardly from each elongated portion 84. The latch portion 86 includes a latching surface 88 and an inclined surface 90.

FIG. 9 illustrates a rear mount housing 44 installed in a cutout 72 of a panel 48. The rear mount housing 44 is installed in the panel 48 by pushing the front wall 32 through the cutout 72. The latching members 78 flex toward the housing as the inclined surface 90 of each latching member is engaged by the panel 48. The latching members snap back out when the latching portion 86 moves past the panel 48. The latching projections hold the tabs 76 of the housing 44 against the panel 48. In the illustrated embodiment, the latching members 78 engage the areas 51 of reduced thickness. In this embodiment, the ends 91 of the latching members 78 are substantially flush with a front surface 93 of the panel 48. The ends 91 would project slightly past the front surface when a flat panel is used.

In the illustrated embodiment, the electrical device 14 is a visual meter, such as an hour meter for a lawn and garden tractor. The disclosed electrical housing assembly could be used to package any type of meter. For example, the disclosed electrical housing assembly could be used to package a tachometer, a service indicator, a fuel gauge, or an oil pressure gauge. In addition, the disclosed electrical housing could be used to seal a terminal end of a wide variety of electrical devices. For example, the disclosed electrical housing could be used to seal a terminal end of an electric switch, a time delay module or a voltage regulator.

The illustrated electrical device 14 is an hour meter for a lawn and garden tractor. The illustrated hour meter includes a liquid crystal display 92 mounted to a printed circuit board 94. The printed circuit board 94 includes an hour meter circuit that drives the liquid crystal display 92. A pair of leads 22 or terminals are electrically connected to the printed circuit for applying power and a monitored signal to the hour meter. The leads 22 extend out the open end 20 of the housing 12. In the embodiment illustrated by FIGS. 3–6, the leads 22 are printed circuit mounted tabs that connect to fast-on™ type lugs, for example 0.187"×0.031" tabs. In the embodiment illustrated by FIGS. 7–10, the leads are rectangular metal posts, for example, 0.045" square posts.

In the illustrated embodiments, the printed circuit board 94 includes notches 98 that fit over protrusions 100 formed on the inside of walls 34, 38. The notches and protrusions 100 ensure proper orientation and alignment of the printed circuit board and liquid crystal display with respect to the housing 12.

Figure 8:
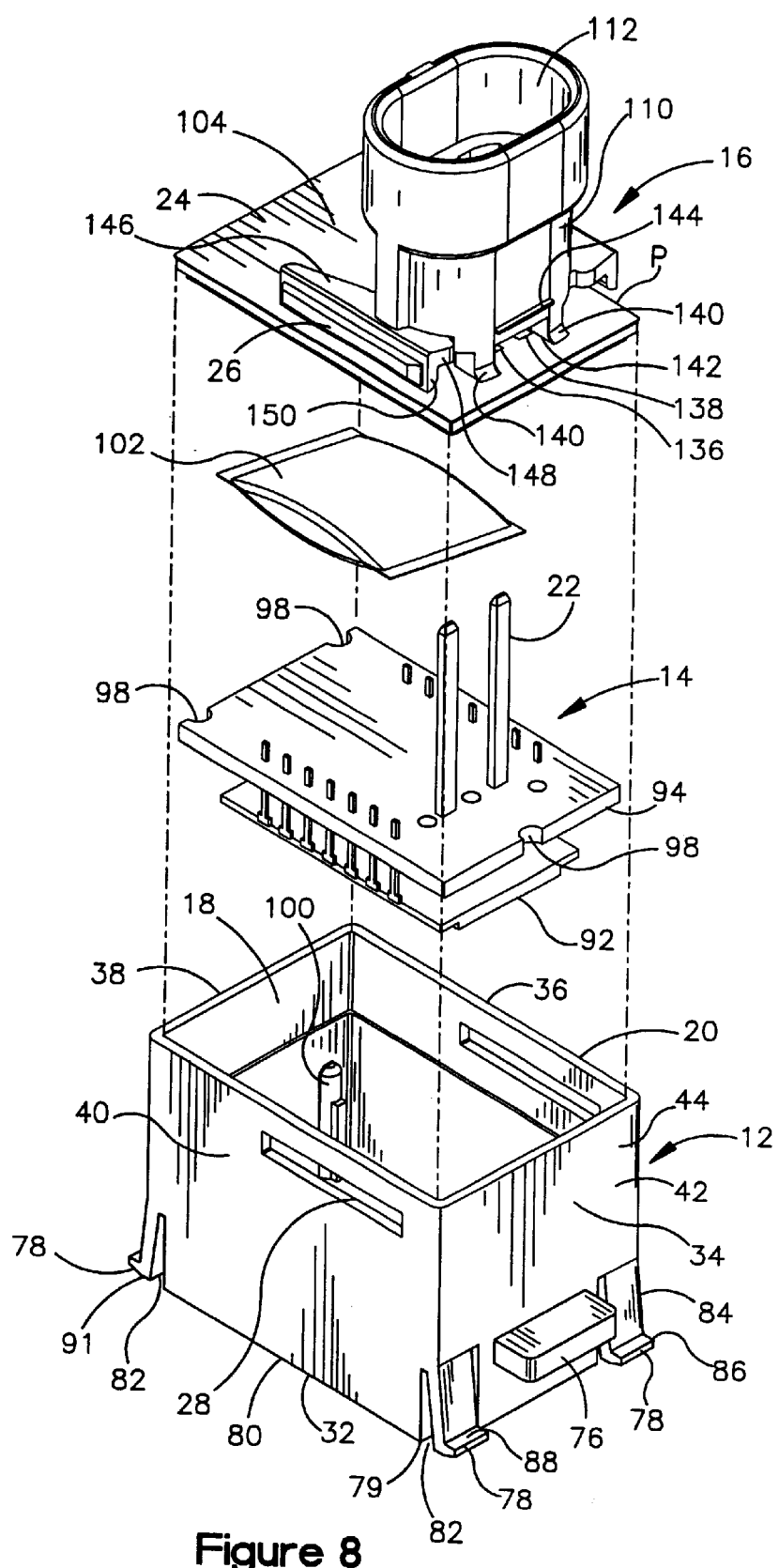
FIG. 8 is an exploded perspective of an electrical meter assembly.

Referring to FIGS. 4 and 8, a package 102 of desiccant is placed in the opening 18 in the housing 12 on top of the printed circuit board. The desiccant absorbs any moisture that may be present in the sealed electrical assembly 10. One acceptable package 102 of desiccant is a silica packet sold under part number 39AG01 by Poly Lam Products Corp.

The cover 16 is positioned within the opening 18 when the electrical assembly 10 is assembled. The cover 16 includes a plate portion 24 and tab portions spaced apart from plate portion 24. The illustrated plate portion 24 is generally flat. It should however be readily apparent that the flat portion need not be completely flat. For example, a back surface 104 of the plate may be crown shaped, i.e, a mound formed in the middle, to reduce the amount of sealant that would be required to ensure that sealant is disposed around the entire perimeter of the plate portion.

The illustrated tab portions 26 are rectangular projections with beveled edges that snap into the rectangular cutouts 28. When the tab portions 26 are disposed in the cutouts 28 the cover's position is secured with respect to the housing. In the exemplary embodiment, the cover 16 includes a projection 25 that extends from the plate portion 24 (FIG. 9). The projection 25 limits movement of the electrical device 14 away from the front wall 32.

The cover illustrated in FIGS. 7–10 is a shrouded cover 110. The shrouded cover 110 includes a shroud 112 around the terminals. The cover illustrated in FIGS. 3–6 is a shroudless cover 114. The shroudless cover 114 does not include a shroud. The shroudless cover illustrated in FIGS. 3–6 could also be used to cover the back mount housing illustrated in FIGS. 7–10. Likewise, the shrouded cover illustrated in FIGS. 7–10 could be used with the front mount housing depicted in FIGS. 3–6.

Referring to FIGS. 3–6, the plate portion 24 includes rectangular cutout 116, 118. The illustrated cutouts have the same general shape, but are slightly larger than the terminals of the electrical assembly mounted in the housing. The terminals extend through the rectangular cutouts 116, 118 past the end of the housing. In the embodiment illustrated by FIGS. 3–6 the cover 114 includes cutouts that correspond to the illustrated fast-on type terminals. It should be readily apparent to those skilled in the art that the cutouts 116, 118 could be sized to fit closely around terminals having a shape other than the shape of the terminals illustrated in FIGS. 3–6. For example, the terminals could be sized to fit around square post terminals illustrated in FIGS. 7–10, a round wire lead or any other terminal shape.

In the embodiment illustrated by FIGS. 3–6, tab portions 26 are connected to the plate portion 24 by a pair of wing portions 120. The illustrated wing portions are connected to the plate portion 24 near a center 124 of the plate. The wing portions 120 illustrated in FIGS. 3–6 include a first segment 122 that extends generally orthogonally away from the plate portion 24. A second segment 126 extends away from the first segment 122 at an angle toward a cutout 28 in a sidewall of the housing 12. In the embodiment illustrated by FIGS. 3–6, a plate-like segment 128 is disposed at an end of the second segment. In this embodiment, the tab portions 26 extend outward from the plate-like segments 128. When the cover 114 is installed in a housing 12 the plate-like segments 128 abut the second and fourth side walls 36, 40 to prevent the wing portions 120 from being pressed through the cutouts 28.

Referring to FIG. 3, the wing portions 120 each include a nub 132 along the length of the angled second segment. In the exemplary embodiment, the nub 132 serves as a target sealant or potting level indicator. An edge 134 formed at the intersection between the second segment 126 and the plate-like segment 128 serves as a maximum sealant or potting level indicator.

Referring now to FIGS. 7–10, the shroud 112 of a shrouded cover 110 accepts a connector that plugs into the shroud to electrically connect the connector to the leads 22. The plate portion 24 illustrated in FIGS. 7–10 includes square cutouts 136, 138. The illustrated cutouts have the same general shape, but are slightly larger than the terminals of the electrical assembly mounted in the housing. The terminals extend through the square cutouts 136, 138 into the shroud 112. In the embodiment illustrated by FIGS. 7–10 the cover 110 includes cutouts that correspond to the illustrated square post type terminals. It should be readily apparent to those skilled in the art that the cutouts 136, 138 could be sized to fit closely around terminals having a shape other than the shape of the terminals illustrated in FIGS.

7–10. For example, the terminals could be sized to fit around fast-on type terminals illustrated in FIGS. 3–6, a round wire lead or any other terminal shape.

In the embodiment illustrated by FIGS. 7–10, the shroud 112 is connected to the plate portion 24 by leg portions 140 that extend generally orthogonally from the plate portion 24. In the illustrated embodiment, there are four leg portions 140 that support the shroud 112. However, it should be readily apparent to those skilled in the art that any number of leg portions could be used to support the shroud 112. In the exemplary embodiment, the leg portions define openings 142 between the plate portion 24 and the shroud 112. In the embodiment illustrated by FIGS. 7–10, four openings are defined by the four leg portions. The openings allow the sealant 30 or potting to flow into the area A between the shroud 112 and plate portion 24 to seal any gap between the cutouts 136, 138 and the leads 22.

The shroud 112 extends out the opening 18 of the housing 12. The illustrated shroud defines an oval shaped opening to accept a Delphi Packard 12052644, or similar type connector. It should be readily apparent to those skilled in the art that the size and shape of the shroud could be changed to accommodate a variety of different types of connectors. The illustrated shroud includes a nubs 144. In the exemplary embodiment, the nub 144 serves as a target sealant or potting level indicator.

In the embodiment illustrated by FIGS. 7–10, tab portions 26 are connected to the plate portion 24 via a pair of wing portions 146 that extend from the shroud 112. The illustrated wing portions are connected near the bottom of the shroud, just above the leg portions 140. The wing portions 146 illustrated in FIGS. 7–10 include a first segment 148 that extends generally orthogonally away from the shroud 112. In the embodiment illustrated by FIGS. 7–10, a plate-like segment 150 is disposed at an end of the first segment 148. In this embodiment, the tab portions 26 extend outward from the plate-like segments 150. When the cover 110 is installed in a housing 12 the plate-like segments 150 abut the second and fourth side walls 36, 40 to prevent the wing portions 146 from being pressed through the cutouts 28.

A sealant 30 or potting is applied to the cover to provide a seal between the cover and the housing and to provide a seal around the leads 22. In the exemplary embodiment, the sealant covers a perimeter P of the plate portion 24 to provide a seal between the cover and the housing and surrounds the leads 22 or terminals to form a seal between the cutouts in the cover and the leads. A portion of the sealant 30 is disposed in a space S between each tab portion 26 and each plate portion 24. One suitable sealant 30 is Kalex 13307 available from Hardman.

Figure 5:
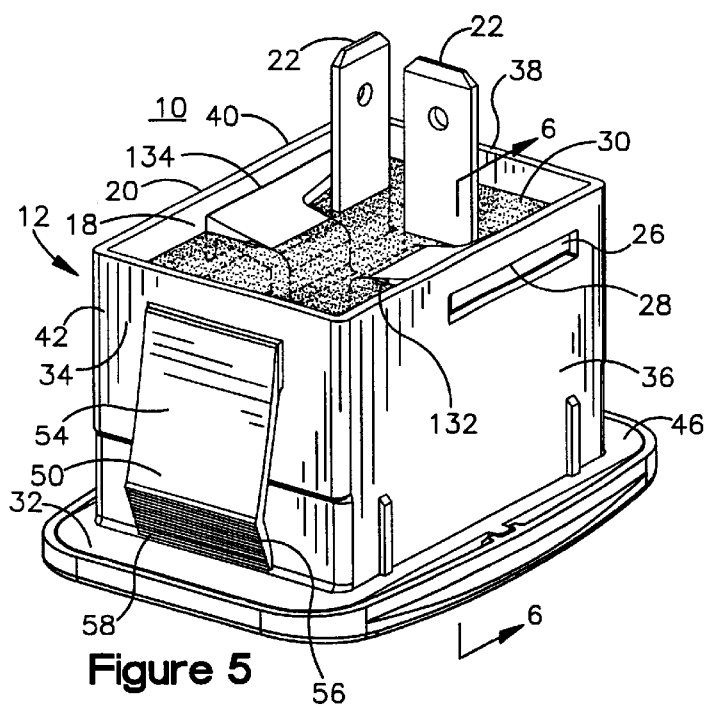
FIG. 5 is a perspective view of a potted or sealed electrical meter assembly.
Figure 6:
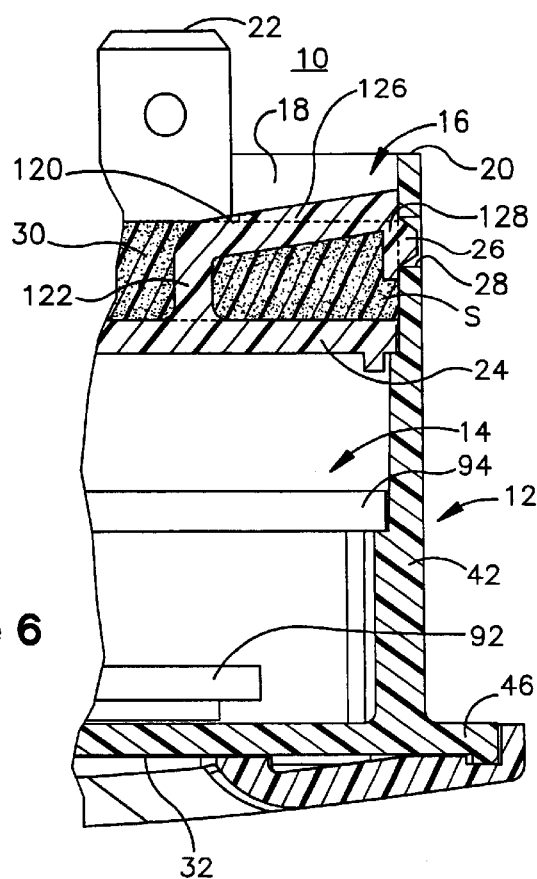
FIG. 6 is a sectional view taken along lines 6—6 of FIG. 5.

In the embodiment illustrated by FIGS. 3–6 sealant is applied to a back side of the plate portion 24 of the cover 16. The sealant 30 flows under the wing portions 120 to fill the space S between the wing portions and the plate portion. This allows the sealant to completely cover the perimeter P of the plate portion 24 and adhere to the side walls 34, 36, 38, 40. A seal is formed between the housing 12 and the cover 16 in this manner. As a result, there is no leakage path into the housing through the cutouts 28, since the sealant is between the cutout and the plate portion (FIG. 6). The sealant flows around the leads 22 to provide a seal between the cutouts 116, 118 and the leads 22. Referring to FIGS. 5 and 6 sealant is applied to the level of nub 132 to ensure that the sealant provides a seal between the cover 16 and the housing 12 and around the leads 22.

Figure 7:
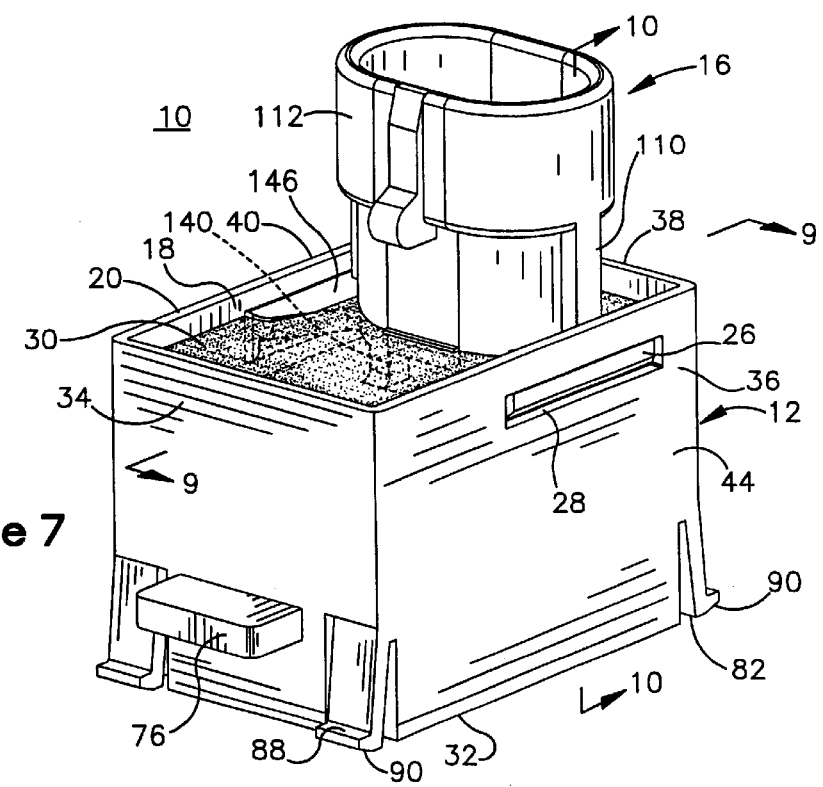
FIG. 7 is a perspective view of a potted or sealed electrical meter assembly.

In the embodiment illustrated by FIGS. 7–10 sealant is applied to a back side of the plate portion 24 of the cover 16. The sealant 30 flows under the wing portions 146 to fill the space S between the wing portions and the plate portion. This allows the sealant to completely cover the perimeter P of the plate portion 24, contact the side walls 34, 36, 38, 40, and form a seal between the housing 12 and the cover 16. As a result, there is no leakage path into the housing through the cutouts 28, since the sealant is between the cutout and the plate portion (FIG. 10). The sealant flows through openings 142 between the shroud 112 and the plate portion and flows around the leads 22 to provide a seal between the cutouts 136, 138 and the leads 22. Referring to FIG. 7 sealant is applied to the level of nub 144 to ensure that the sealant provides a seal between the cover 16 and the housing 12 and around the leads 22.

A visible meter assembly is put together by positioning a meter circuit including a display in the transparent housing. The metering circuit includes a pair of leads that extend out of the open end 20.

A cover is positioned in the opening such that the pair of leads 22 extend through the cover. The pair of rectangular tab portions are inserted into the pair of rectangular cutouts in side walls of said housing to position said cover with respect to said housing.

A sealant or potting material is applied around a perimeter of the cover to provide a seal between the cover and the housing. A portion of the sealant is applied in the space between the cutouts and the plate portion of the cover.

The sealant is also applied around said leads to provide a seal around said leads.

The disclosed electrical assembly is sealed and is very easy to put together. When the housing is made from a transparent material, the electrical components enclosed in the housing can be visually inspected after the housing assembly is sealed. The housing assembly of the present invention prevents a sealant or potting from contacting the electrical components in the housing, such as a display that would be impaired if potting were to come into contact with it.

While the present invention has been described with a degree of particularity, it is the intent that the invention include all modifications and alterations from the disclosed embodiments falling within the spirit or scope of the appended claims.

I claim:

1. A sealed electrical assembly, comprising:
   a) a housing having an opening at an end;
   b) an electrical device positioned in said housing, said electrical device including a lead that extends out of said open end;
   c) a cover positioned within said opening, said cover including a plate portion and a tab portion spaced apart from said plate portion, said tab portion extends into a cutout in said housing that is located between said plate portion and said housing end to position said cover with respect to said housing; and
   d) a sealant disposed around a perimeter of said plate portion to provide a seal between said cover and said housing, a portion of said sealant being disposed in a space between said cutout and said plate portion, such that said portion of said sealant in said space contacts said housing.

2. The assembly of claim 1 wherein said sealant provides a seal around said lead.

3. The assembly of claim 1 further comprising an opaque faceplate that snaps onto said front wall.

4. A sealed electrical assembly, comprising:
 a) a housing made from a transparent material having an opening at an end;
 b) an electrical device positioned in said housing, said electrical device including a lead that extends out of said open end;
 c) a cover positioned within said opening, said cover including a plate portion and a tab portion spaced apart from said plate portion, said tab portion extends into a cutout in said housing that is located between said plate portion and said housing end to position said cover with respect to said housing; and
 d) a sealant disposed around a perimeter of said plate portion to provide a seal between said cover and said housing, a portion of said sealant being disposed in a space between said cutout and said plate portion.

5. The assembly of claim 1 wherein said electrical device is an hour meter.

6. A sealed electrical assembly, comprising:
 a) a housing having an opening at an end, wherein said housing is a single molded piece that includes a front wall and four side walls;
 b) an electrical device positioned in said housing, said electrical device including a lead that extends out of said open end;
 c) a cover positioned within said opening. said cover including a plate portion and a tab portion spaced apart from said plate portion, said tab portion extends into a cutout in said housing that is located between said plate portion and said housing end to position said cover with respect to said housing; and
 d) a sealant disposed around a perimeter of said plate portion to provide a seal between said cover and said housing, a portion of said sealant being disposed in a space between said cutout and said plate portion.

7. A sealed electrical assembly, comprising:
 a) a housing having an opening at an end;
 b) an electrical device positioned in said housing, said electrical device including a lead that extends out of said open end;
 c) a cover positioned within said opening, said cover including a plate portion and a tab portion spaced apart from said plate portion, said tab portion extends into a cutout in said housing that is located between said plate portion and said housing end to position said cover with respect to said housing;
 d) a sealant disposed around a perimeter of said plate portion to provide a seal between said cover and said housing, a portion of said sealant being disposed in a space between said cutout and said plate portion; and
 e) an opaque faceplate welded to said housing.

8. A sealed electrical assembly, comprising:
 a) a housing having an opening at an end;
 b) an electrical device positioned in said housing, said electrical device including a lead that extends out of said open end;
 c) a cover positioned within said opening, said cover including a plate portion and a tab portion spaced apart from said plate portion, said tab portion extends into a cutout in said housing that is located between said plate portion and said housing end to position said cover with respect to said housing;
 d) a sealant disposed around a perimeter of said plate portion to provide a seal between said cover and said housing, a portion of said sealant being disposed in a space between said cutout and said plate portion; and
 e) an opaque faceplate molded onto a front wall of said housing.

9. A sealed electrical assembly, comprising:
 a) a housing having an opening at an end;
 b) an electrical device positioned in said housing, said electrical device including a lead that extends out of said open end;
 c) a cover positioned within said opening, said cover including a plate portion and a tab portion spaced apart from said plate portion, said tab portion extends into a cutout in said housing that is located between said plate portion and said housing end to position said cover with respect to said housing;
 d) a sealant disposed around a perimeter of said plate portion to provide a seal between said cover and said housing, a portion of said sealant being disposed in a space between said cutout and said plate portion; and
 e) an opaque faceplate that snaps onto said housing.

10. A sealed visible meter assembly, comprising:
 a) a transparent housing having a front wall, four side walls and an opening at an end;
 b) a meter circuit including a display positioned in said housing, said metering circuit including a pair of leads that extend out of said open end;
 c) a cover positioned within said opening, said cover including a plate portion, a wing portion extending away from a surface of said plate portion, and a rectangular tab portion that extends from said wing portion, said tab portion extends into cutouts in said housing that is located between said plate portion and said housing end to position said cover with respect to said housing; and
 d) a sealant disposed around a perimeter of said plate portion to provide a seal between said cover and said housing and around said leads to provide a seal around said leads, a portion of said sealant being disposed in a space between said tab portion and said plate portion.

11. The assembly of claim 10 wherein said meter circuit is an hour meter circuit.

12. The assembly of claim 10 further comprising an opaque faceplate welded to said housing.

13. The assembly of claim 10 further comprising an opaque faceplate molded onto a front wall of said housing.

14. The assembly of claim 10 further comprising latching projections extending from said housing that facilitate mounting of said meter assembly to a panel from a rear of said panel.

15. A method of sealing an electrical assembly, comprising:
 a) positioning an electrical device in a housing having an open end such that a lead of said electrical device extends out of said open end;
 b) positioning a cover including a plate portion and a tab portion spaced apart from said plate portion in said housing;
 c) inserting said tab portion into a cutout in said housing that is located between said plate portion and said housing end; and
 d) applying a sealant around a perimeter of said plate portion to provide a seal between said cover and said housing, a portion of said sealant being applied in a space between said tab portion and said plate portion, such that said portion of said sealant in said space contacts said housing.

16. The method of claim 15 further comprising applying sealant around said lead to provide a seal around said lead.

17. A method of sealing an electrical assembly, comprising:
   a) positioning an electrical device in a housing having an open end such that a lead of said electrical device extends out of said open end;
   b) positioning a cover including a plate portion and a tab portion spaced apart from said plate portion in said housing;
   c) inserting said tab portion into a cutout in said housing that is located between said plate portion and said housing end;
   d) applying a sealant around a perimeter of said plate portion to provide a seal between said cover and said housing, a portion of said sealant being applied in a space between said tab portion and said plate portion; and
   e) welding an opaque faceplate to said housing.

18. A method of sealing a visible meter assembly, comprising:
   a) positioning a meter circuit including a display in a transparent housing having a front wall, four side walls and an opening at an end, said metering circuit including a pair of leads that extend out of said open end;
   b) positioning a cover in said opening such that said pair of leads extend through said cover;
   c) inserting a pair of rectangular tab portions into a pair of rectangular cutouts in side walls of said housing to position said cover with respect to said housing;
   d) applying a sealant around a perimeter of said cover to provide a seal between said cover and said housing, a portion of said sealant being applied in a space between said tab portion and said plate portion of said cover; and
   e) applying said sealant around said leads to provide a seal around said leads.

19. The method of claim 18 further comprising welding an opaque faceplate to said housing.

20. A sealed visible meter assembly, comprising:
   a) a transparent housing having a front wall, and an opening at an end;
   b) a meter circuit including a display positioned in said housing, said metering circuit including a pair of leads that extend out of said open end;
   c) a cover positioned within said opening, said cover including a plate portion, leg portions extending away from a surface of said plate portion, a shroud portion extending from said leg portions, a wing portion that extends from said shroud portion and a rectangular tab portion that extends from said wing portion, said tab portion extends into cutouts in said housing that is located between said plate portion and said housing end to position said cover with respect to said housing; and
   d) a sealant disposed around a perimeter of said plate portion to provide a seal between said cover and said housing and around said leads to provide a seal around said leads, a first portion of said sealant being disposed in a space between said tab portion and said plate portion, a second portion of said sealant being disposed in an area between said shroud portion and said plate portion around said pair of leads.

* * * * *